(12) United States Patent
Ohata et al.

(10) Patent No.: US 9,076,636 B2
(45) Date of Patent: Jul. 7, 2015

(54) PLASMA PROCESSING APPARATUS, PLASMA PROCESSING METHOD AND STORAGE MEDIUM FOR STORING PROGRAM FOR EXECUTING THE METHOD

(75) Inventors: Mitsunori Ohata, Nirasaki (JP); Hidetoshi Kimura, Nirasaki (JP); Kiyoshi Maeda, Kurokawa (JP); Jun Hirose, Kurokawa (JP); Tsuyoshi Hida, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 484 days.

(21) Appl. No.: 13/232,207

(22) Filed: Sep. 14, 2011

(65) Prior Publication Data

US 2012/0061351 A1   Mar. 15, 2012

Related U.S. Application Data

(60) Provisional application No. 61/389,425, filed on Oct. 4, 2010.

(30) Foreign Application Priority Data

Sep. 14, 2010   (JP) ................ 2010-206020

(51) Int. Cl.
| | |
|---|---|
| C23C 16/00 | (2006.01) |
| H01L 21/306 | (2006.01) |
| C23F 1/00 | (2006.01) |
| H01J 7/24 | (2006.01) |
| H05B 31/26 | (2006.01) |
| H01J 37/32 | (2006.01) |
| H01L 21/67 | (2006.01) |
| H01L 21/687 | (2006.01) |

(52) U.S. Cl.
CPC ...... *H01J 37/32642* (2013.01); *H01J 37/32091* (2013.01); *H01L 21/67069* (2013.01); *H01L 21/68735* (2013.01)

(58) Field of Classification Search
USPC ................ 156/345.43–345.47; 118/715, 722, 118/723 R, 723 E
See application file for complete search history.

(56) References Cited

U.S. PATENT DOCUMENTS

| | | | | |
|---|---|---|---|---|
| 8,293,068 | B2 * | 10/2012 | Koshimizu et al. ...... | 156/345.47 |
| 2008/0236749 | A1 * | 10/2008 | Koshimizu et al. ...... | 156/345.33 |
| 2009/0223810 | A1 * | 9/2009 | Dhindsa et al. ............... | 204/164 |

(Continued)

FOREIGN PATENT DOCUMENTS

| | | |
|---|---|---|
| JP | 2003-519907 A | 6/2003 |
| JP | 2005-277369 A | 10/2005 |
| JP | 2005-539397 A | 12/2005 |

(Continued)

*Primary Examiner* — Maureen Gramaglia
(74) *Attorney, Agent, or Firm* — Pearne & Gordon LLP

(57) ABSTRACT

There is provided a plasma processing apparatus including a susceptor 114, having a substrate mounting portion for mounting thereon a substrate, to which a high frequency power is applied; a focus ring 210, disposed to surround the substrate mounted on the substrate mounting portion, including an outer ring 214 having a top surface higher than a top surface of the substrate and an inner ring 212 extending inwardly from the outer ring so as to allow at least a part of the inner ring to be positioned below a periphery of the substrate, the outer ring and the inner ring being formed as a single member; a dielectric ring 220 positioned between the focus ring and the susceptor; a dielectric constant varying device 250 for varying a dielectric constant of the dielectric ring.

5 Claims, 17 Drawing Sheets

(56) References Cited

U.S. PATENT DOCUMENTS

2009/0242135 A1* 10/2009 Koshimizu et al. ...... 156/345.48
2010/0176086 A1* 7/2010 Iwata .............................. 216/71

FOREIGN PATENT DOCUMENTS

| WO | 2004/027816 A2 | 4/2004 |
| WO | 2009/006072 A2 | 1/2009 |

* cited by examiner

FIG. 16

| TOP SURFACE ELECTRIC POTENTIAL CONTROL DATA OF FOCUS RING | | |
|---|---|---|
| TYPE OF WAFER | POSITION OF CONDUCTOR | POSITION OF GROUNDING BODY |
| | DURING PROCESS | DURING DEPOSIT ETCHING PROCESS |
| X | $A_X$ | $B_X$ |
| Y | $A_Y$ | $B_Y$ |
| ⋮ | ⋮ | ⋮ |

PLASMA PROCESSING APPARATUS, PLASMA PROCESSING METHOD AND STORAGE MEDIUM FOR STORING PROGRAM FOR EXECUTING THE METHOD

CROSS-REFERENCE TO RELATED APPLICATION

This application claims the benefit of Japanese Patent Application No. 2010-206020 filed on Sep. 14, 2010 and U.S. Provisional Application Ser. No. 61/389,425 filed on Oct. 4, 2010, the entire disclosures of which are incorporated herein by reference.

FIELD OF THE INVENTION

The present disclosure relates to a plasma processing apparatus including a focus ring disposed to surround a periphery of a substrate, and also relates a plasma processing method and a storage medium for storing a program for executing the plasma processing method.

BACKGROUND OF THE INVENTION

In manufacturing processes of a semiconductor device, in order to form a micro circuit pattern on a substrate such as a semiconductor wafer, a FPD substrate or a substrate for a solar cell, a certain process such as an etching process or a film formation process is repetitively performed on the substrate. Such process is carried out by a plasma processing apparatus.

The plasma processing apparatus includes, by way of example, a depressurizable processing chamber capable of introducing therein a processing gas, and a mounting table is provided in the processing chamber. A susceptor to which a high frequency power is applied is provided on the mounting table, and a substrate is mounted on a substrate mounting portion formed on a substantially center of the susceptor. An electrostatic attraction portion is formed on the substrate mounting portion, and the substrate mounted on the substrate mounting portion is held by an electrostatic attraction force.

In this plasma processing apparatus, the processing gas is introduced into the processing chamber, and the high frequency power is applied to the susceptor. Further, plasma of the processing gas is generated on the substrate held by the substrate mounting portion, and a process such as an etching process or a film formation process is performed on the substrate. Here, in order to perform a uniform and favorable process at a periphery of the substrate as well as at a center thereof, a focus ring is provided so as to surround the substrate mounted on the substrate mounting portion.

When the focus ring is provided, the process quality at the periphery of the substrate is affected by a top surface electric potential of the focus ring. For this reason, there has been developed a technique capable of changing the top surface electric potential of the focus ring by providing a dielectric member between the focus ring and the susceptor (see Patent Documents 1 and 2). By way of example, Patent Document 1 describes a technique for changing the top surface electric potential of the focus ring by providing the dielectric member therebetween so as to change impedance between the focus ring and the susceptor.

Meanwhile, Patent Document 2 describes a technique for removing deposits (CF-based polymer or the like) adhering to a rear surface of the periphery of the substrate by positioning an inner periphery of the focus ring below the periphery of the substrate and by providing the dielectric member between the focus ring and the susceptor. By providing the dielectric member between the focus ring and the susceptor, the impedance therebetween is increased. As a result, the electric potential of the focus ring during a plasma process is decreased to a level of the plasma potential. As described above, an electric field due to a potential difference is generated between the substrate (susceptor) and the inner side of the focus ring during the plasma process by changing the top surface electric potential of the focus ring. Therefore, ions in the plasma are attracted and introduced toward the periphery of the substrate due to the effect of the electric field, so that the deposits adhering to the periphery of the substrate can be removed.

Patent Document 1: Japanese Patent Laid-open Publication No. 2003-519907
Patent Document 2: Japanese Patent Laid-open Publication No. 2005-277369

Meanwhile, a resistance of the substrate as a target object varies depending on a material or a surface structure of the substrate. Further, a distance between the focus ring and the susceptor is changed depending on a thickness of the substrate mounting portion, a thickness of the dielectric member, a shape of the susceptor, or the like. Hence, when the dielectric member is provided between the focus ring and the susceptor as described above, a current may easily flow from the substrate toward the focus ring depending on a type of substrate or the distance between the focus ring and the susceptor. Accordingly, there are problems that a voltage applied to the periphery of the substrate may become non-uniform, and the top surface electric potential of the focus ring may be decreased to a level lower than a desired potential. As a result, the top surface electric potential of the focus ring may become non-uniform depending on a type of substrate.

However, in the above-described conventional plasma processing apparatus, the dielectric member needs to be replaced with other one in order to change a dielectric constant between the focus ring and the susceptor. In this way, since the dielectric member needs to be replaced whenever a type of the substrate is changed, a throughput may be decreased.

BRIEF SUMMARY OF THE INVENTION

In view of the foregoing, the present disclosure provides a plasma processing apparatus capable of applying a uniformized voltage to a periphery of a substrate and controlling a top surface electric potential of a focus ring to a desired value by adjusting a dielectric constant of a dielectric ring without exchanging the dielectric ring.

In accordance with one aspect of the present disclosure, there is a plasma processing apparatus for performing a plasma process on a substrate by plasma. The plasma processing includes a susceptor, having a substrate mounting portion for mounting thereon the substrate, to which a high frequency power is applied; a focus ring, disposed to surround the substrate mounted on the substrate mounting portion, including an outer ring having a top surface higher than a top surface of the substrate and an inner ring extending inwardly from the outer ring so as to allow at least a part of the inner ring to be positioned below a periphery of the substrate, the outer ring and the inner ring being formed as a single member; a dielectric ring positioned between the focus ring and the susceptor; a dielectric constant varying device for varying a dielectric constant of the dielectric ring; and a controller for controlling a top surface electric potential of the focus ring by adjusting the dielectric constant of the dielectric ring through the use of the dielectric constant varying device. Here, the controller may adjust the dielectric constant of the dielectric ring depending on, for example, a type of the substrate.

In accordance with the present disclosure, the dielectric constant of the dielectric ring may be adjusted by the dielectric constant varying device without exchanging the dielectric ring even when the type of the substrate is changed. Accordingly, a current may easily flow from the susceptor toward the focus ring, whereas a current may hardly flow from the substrate toward the focus ring. As a result, it is possible to apply the uniformized voltage to the periphery of the substrate and suppress the decrease in the top surface electric potential of the focus ring.

Further, since the top surface electric potential of the focus ring is not changed depending on the type of the substrate, the top surface electric potential of the focus ring may be maintained at a high level by adjusting the dielectric constant of the dielectric ring. Accordingly, it is possible to improve a processing rate of the process at the periphery of the substrate or the deposit etching process.

By way of example, the dielectric constant varying device may be a conductor elevation device for vertically moving a conductor in a space formed within the dielectric ring. With this configuration, it may be possible to adjust the dielectric constant by vertically moving the conductor without exchanging the dielectric ring. The dielectric constant varying device may be configured to circulate a dielectric fluid through a space formed within the dielectric ring. With this configuration, without exchanging the dielectric ring, it may be possible to adjust the dielectric constant by introducing the dielectric fluid into the space formed within the dielectric ring or by discharging the dielectric fluid from the space. Alternatively, it may be possible to adjust the dielectric constant by introducing a dielectric fluid having a different dielectric constant into the space.

Further, the plasma processing apparatus may further include a grounding body maintained at a ground potential and positioned at an outside of the dielectric ring with a gap from a bottom surface of the focus ring; and a grounding body elevation device for vertically moving the grounding body. Here, the controller may control the top surface electric potential of the focus ring by vertically moving the grounding body through the use of the grounding body elevation device. Accordingly, the top surface electric potential of the focus ring may be adjusted by vertically moving the grounding body without changing the dielectric constant of the dielectric ring.

In accordance with another aspect of the present disclosure, there is a plasma processing method performed by a plasma processing apparatus including a susceptor, having a substrate mounting portion for mounting thereon the substrate, to which a high frequency power is applied; a focus ring, disposed to surround the substrate mounted on the substrate mounting portion, including an outer ring having a top surface higher than a top surface of the substrate and an inner ring extending inwardly from the outer ring so as to allow at least a part of the inner ring to be positioned below a peripheral portion of the substrate, the outer ring and the inner ring being formed as a single member; a dielectric ring positioned between the focus ring and the susceptor; and a conductor elevation device for vertically moving a conductor in a space formed within the dielectric ring and varying the dielectric constant of the dielectric ring, the plasma processing method performing a process on a substrate by plasma. The plasma processing method may include performing the process on a surface of the substrate after adjusting a position of the conductor depending on a type of the substrate.

In accordance with still another aspect of the present disclosure, there is a computer-readable storage medium having stored thereon computer-executable instructions that, in response to execution, cause a plasma processing apparatus to perform a plasma processing method. Here, the plasma processing apparatus may include a susceptor, having a substrate mounting portion for mounting thereon the substrate, to which a high frequency power is applied; a focus ring, disposed to surround the substrate mounted on the substrate mounting portion, including an outer ring having a top surface higher than a top surface of the substrate and an inner ring extending inwardly from the outer ring so as to allows at least a part of the inner ring to be positioned below a periphery of the substrate, the outer ring and the inner ring being formed as a single member; a dielectric ring positioned between the focus ring and the susceptor; and a conductor elevation device for vertically moving a conductor in a space formed within the dielectric ring. The plasma processing method may include performing the processing on a surface of the substrate after adjusting a position of the conductor depending on a type of the substrate.

In accordance with the present disclosure, without exchanging the dielectric ring even when the type of the substrate is changed, the dielectric constant of the dielectric ring may be adjusted by vertically moving the conductor in the space within the dielectric ring. Accordingly, a current may easily flow from the susceptor toward the focus ring, whereas a current may hardly from the substrate toward the focus ring. As a result, it may be possible to apply the uniformized voltage to the periphery of the substrate and suppress the decrease in the top surface electric potential of the focus ring.

Here, the plasma processing apparatus may further include a grounding body maintained at a ground potential and positioned at an outside of the dielectric ring with a gap from a bottom surface of the focus ring; and a grounding body elevation device for vertically moving the grounding body. In the plasma processing method, the process may be performed on the surface of the substrate after adjusting the position of the conductor depending on the type of the substrate while the grounding body is positioned to a reference position which is most distance from the focus ring. Further, after the process is completed, a deposit etching process for etching a deposit adhering to the periphery of the substrate may be performed after adjusting the position of the grounding body toward the focus ring without changing the position of the conductor.

With this configuration, by vertically moving the grounding body, the top surface electric potential of the focus ring may be adjusted while maintaining the dielectric constant of the dielectric ring. Further, during the deposit etching process at the substrate periphery, the top surface electric potential of the focus ring may be reduced by adjusting the position of the grounding body toward the focus ring. Accordingly, a large potential difference between the substrate (susceptor) and the inner periphery of the focus ring may be generated. As a result, it may be possible to increase the processing rate of the deposit etching process while maintaining the dielectric constant of the dielectric ring.

In accordance with the present disclosure, there is provided the dielectric constant varying device capable of adjusting the dielectric constant of the dielectric ring provided between the focus ring and the susceptor. Accordingly, the dielectric constant of the dielectric ring may be adjusted without exchanging the dielectric ring. As a result, it may be possible to apply the uniformized voltage to the periphery of the substrate, and also possible to control the top surface electric potential of the focus ring to a desired value.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 16 is a diagram for describing a specific example of data to be used in controlling the top surface electric potential of the focus ring as shown in FIG. 15.

DETAILED DESCRIPTION OF THE INVENTION

Figure 1:
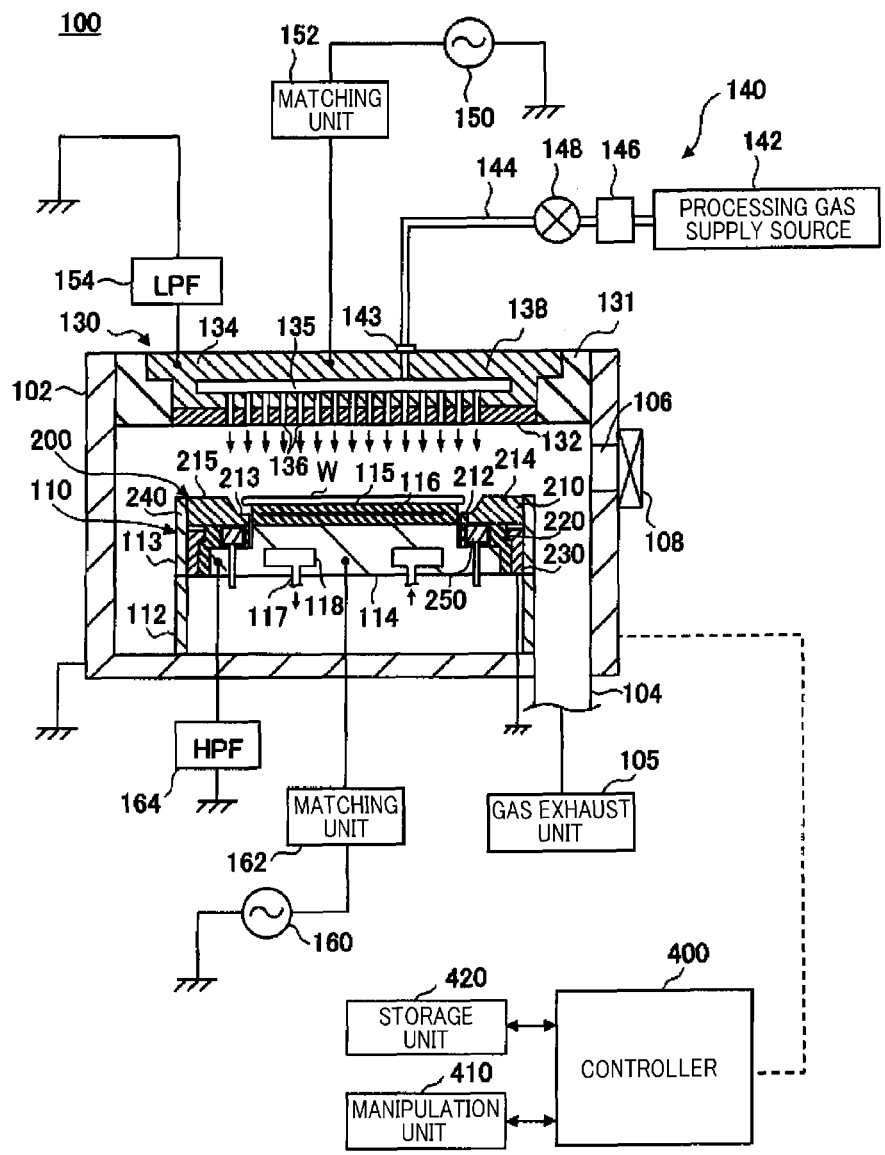
FIG. 1 is a longitudinal cross sectional view showing a schematic configuration of a plasma processing apparatus in accordance with an embodiment of the present disclosure.

Hereinafter, the embodiments of the present disclosure will be described in detail with reference to the accompanying drawings. In the specification and the accompanying drawings, same reference numerals will be given to same parts having substantially the same functions and configurations, and redundant description thereof will be omitted.

(Configuration Example of Plasma Processing Apparatus)

First, a schematic configuration of a plasma processing apparatus in accordance with an embodiment of the present disclosure will be described with reference to the accompanying drawings. Here, a parallel plate type plasma processing apparatus will be explained as an example apparatus. FIG. 1 is a longitudinal cross sectional view showing a schematic configuration of a plasma processing apparatus 100 in accordance with the embodiment of the present disclosure.

The plasma processing apparatus 100 may include a processing chamber 102 having therein a cylindrical processing vessel made of, e.g., aluminum whose surface is anodically oxidized (alumite treated). The processing chamber 102 is grounded. A substantially columnar mounting table 110 for mounting a wafer W thereon is provided at a bottom of the processing chamber 102.

The mounting table 110 may be configured such that a lower electrode 113 is supported by an insulator 112 made of, e.g., ceramic. The lower electrode 113 may have therein a susceptor 114 as a main body thereof. The susceptor 114 may have a substrate mounting portion protruded from the center thereof. Therefore, a central portion of the susceptor 114 may be higher than a periphery thereof.

The substrate mounting portion is formed to have a smaller diameter than that of the wafer W. When the wafer W is mounted on the substrate mounting portion, a periphery of the wafer W is protruded. For this reason, when a process is performed on the wafer W, compositions of a processing gas may reach a rear surface of the periphery of the wafer W, and deposits (CF polymer or the like) may adhere to the rear surface of the periphery of the wafer W. These deposits can be removed by a deposit etching process to be described later.

A focus ring device 200 is provided at the susceptor 114. The focus ring device 200 may include a focus ring 210 provided so as to surround the substrate mounting portion of the susceptor 114 and the wafer W mounted on a surface of the substrate mounting portion.

In the focus ring device 200 in accordance with the present embodiment, a top surface electric potential of the focus ring 210 can be adjusted. By adjusting the top surface electric potential of the focus ring 210, a plasma sheath above a portion ranging from the focus ring 210 to the periphery of the wafer can be adjusted. Accordingly, it is possible to control a processing rate (e.g., an etching rate, a film forming rate, or the like) at the periphery of the wafer or a voltage applied to the periphery of the wafer. As a result, it is possible to perform uniformized processes at the periphery and a center of the wafer W. Further, it is also possible to improve a processing rate of the etching process of the deposits adhering to the periphery of the wafer. A detailed configuration example of the focus ring device 200 will be described later.

Provided on a top surface of the substrate mounting portion of the susceptor 114 is an electrostatic chuck 115 for holding the wafer W by an electrostatic attraction force. The electrostatic chuck 115 is made of, e.g., ceramic, and an electrode 116 is provided therein. A non-illustrated DC power supply is connected to the electrode 116. With this configuration, a DC voltage (e.g., about 1500 V) may be applied from the DC power supply to the electrode 116. The wafer W is attracted to and held on the electrostatic chuck 115.

A susceptor temperature controller 117 is formed within the susceptor 114. The susceptor temperature controller 117 is configured to circulate a temperature control medium through, e.g., a temperature control medium path 118 formed in a ring shape within the susceptor 114. By the circulation of the temperature control medium, the temperature of the susceptor 114 can be controlled to a desired temperature.

Further, although not shown, a gas passage for supplying a heat transfer medium (e.g., a backside gas such as a He gas) onto the rear surface of the wafer W is also formed within the susceptor 114. A heat transfer between the susceptor 114 and the wafer W may be made by the heat transfer medium, so that the wafer W is maintained at a certain temperature.

An upper electrode 130 is provided above the lower electrode 113 so as to face the lower electrode 113. A space formed between the upper electrode 130 and the lower electrode 113 serves as a plasma generation space. The upper electrode 130 is supported at an upper portion of the processing chamber 102 via an insulating shield member 131.

The upper electrode 130 may mainly include an electrode plate 132 and an electrode support 134 detachably supporting the electrode plate 132. The electrode plate 132 is made of, e.g., quartz, and the electrode support 134 is made of a conductive material such as aluminum whose surface is alumite-treated.

The electrode support 134 is connected with a processing gas supply unit 140 for introducing a processing gas from a processing gas supply source 142 into the processing chamber 102. The processing gas supply source 142 is connected to a gas inlet opening 143 of the electrode support 134 via a gas supply line 144.

A mass flow controller (MFC) 146 and an opening/closing valve 148 are provided at the gas supply line 144 in sequence from an upstream side, as shown in FIG. 1. Alternatively, a FCS (Flow Control System) may be used instead of the MFC. The processing gas supply source 142 supplies a certain processing gas. By way of example, when an etching process is performed, a fluorocarbon gas ($C_xF_y$) such as a $C_4F_8$ is supplied as the processing gas.

Further, in FIG. 1, only one processing gas supply system including the gas supply line 144, the opening/closing valve 148, the mass flow controller 146 and the processing gas supply source 142 is shown. However, the plasma processing apparatus 100 has a multiple number of processing gas supply systems. By way of example, processing gases such as $CF_4$, $O_2$, $N_2$ and $CHF_3$ are supplied into the processing chamber 102 while flow rates thereof are independently controlled.

Formed within the electrode support 134 is a gas diffusion space 135 having, e.g., a substantially cylindrical shape, and the processing gas introduced through the gas supply line 144 can be diffused uniformly. A multiple number of gas discharge holes 136 for discharging the processing gas from the gas diffusion space 135 into the processing chamber 102 are formed in a bottom of the electrode support 134 and through the electrode plate 132. The processing gas diffused into the gas diffusion space 135 can be discharged uniformly toward the plasma generation space from the gas discharge holes 136. The upper electrode 130 serves as a shower head for supplying the processing gas.

A gas exhaust line 104 is connected to a bottom of the processing chamber 102, and a gas exhaust unit 105 is connected to the gas exhaust line 104. The gas exhaust unit 105 may include, e.g., a vacuum pump and is capable of depressurizing an inside of the processing chamber 102 to a certain depressurized atmosphere. Further, a loading/unloading port 106 for the wafer W is formed in a sidewall of the processing chamber 102, and a gate valve 108 is provided at the loading/unloading port 106. When loading/unloading the wafer W, the gate valve 108 becomes opened. The wafer W is loaded into or unloaded from the processing chamber 102 by a non-illustrated transfer arm through the loading/unloading port 106.

A first high frequency power supply 150 is connected to the upper electrode 130, and a first matching unit 152 is provided at a power supply line thereof. The first high frequency power supply 150 is capable of outputting a high frequency power for plasma generation, and the high frequency power has a frequency ranging from about 50 MHz to about 150 MHz. By applying such a high frequency power to the upper electrode 130, high density plasma in a desirable dissociated state can be generated within the processing chamber 102, so that a plasma process can be performed under a lower pressure condition. Desirably, the output power of the first high frequency power supply 150 may have a frequency of about 50 MHz to about 80 MHz, and, typically, about 60 MHz or thereabout.

A second high frequency power supply 160 is connected to the susceptor 114 serving as the lower electrode, and a second matching unit 162 is provided at a power supply line thereof. The second high frequency power supply 160 is capable of outputting a high frequency bias power having a frequency ranging from about several hundreds of kHz to about several tens of MHz. Typically, the output power of the second high frequency power supply 160 may have a frequency of about 2 MHz or about 13.56 MHz.

Further, a high pass filter (HPF) 164 for filtering a high frequency current flowing into the susceptor 114 from the first high frequency power supply 150 is connected to the susceptor 114. Meanwhile, a low pass filter (LPF) 154 for filtering a high frequency current flowing into the upper electrode 130 from the second high frequency power supply 160 is connected to the upper electrode 130.

A controller (overall control device) 400 is connected to the plasma processing apparatus 100. Each of components of the plasma processing apparatus 100 is controlled by the controller 400. Further, connected to the controller 400 is a manipulation unit 410 including a key board for allowing an operator to input a command to manage the plasma processing apparatus 100 or a display for visualizing and displaying an operation state of the plasma processing apparatus 100.

Further, connected to the controller 400 is a storage unit 420 for storing therein programs for implementing various processes (for example, an etching process on a surface of the wafer W, a film forming process on the surface of the wafer W or a etching process of deposits adhering to the periphery of the wafer W) performed in the plasma processing apparatus 100 under the control of the controller 400. Further, the storage unit 420 also stores therein processing conditions (recipes) necessary for executing the programs.

By way of example, a multiple number of processing conditions (recopies) is stored in the storage unit 420. Each processing condition includes a multiple number of parameter values such as control parameters for controlling each component of the plasma processing apparatus 100 and setup parameters. By way of example, each processing condition includes parameter values such as a flow rate ratio of processing gases, a pressure in the processing chamber, and a high frequency power value. Further, in the present embodiment, like top surface electric potential control data shown in FIG. 16 to be described later, data for controlling the top surface electric potential of the focus ring 210 is stored in relevant to each kind of wafer W.

Further, the programs or the processing conditions may be stored in a hard disk or a semiconductor memory, or may be set in a certain area of the storage unit 420 in the form of a portable storage medium such as a CD-ROM or a DVD, readable by a computer.

The controller 400 reads out a program and a processing condition from the storage unit 420 in response to an instruction from the manipulation unit 410, and controls each component of the plasma processing apparatus 100. In this way, a desired process in the plasma processing apparatus 100 may be performed. Further, the processing condition can be edited by the manipulation unit 410.

In the plasma processing apparatus 100 having the above-described configuration, when a certain process is performed on the wafer W, by way of example, the wafer W is loaded into the processing chamber 102 by the non-illustrated transfer arm and mounted on the mounting table 110. The wafer W is attracted to and held on the electrostatic chuck 115. A certain processing gas is introduced into the processing chamber 102 from the processing gas supply source 142, and the inside of the processing chamber 102 is depressurized to a certain vacuum level by the gas exhaust unit 105.

While the certain vacuum level is maintained, a high frequency power of, e.g., about 60 MHz for plasma generation is applied to the upper electrode 130 from the first high frequency power supply 150, and a high frequency bias power of, e.g., about 2 MHz is applied to the susceptor 114 of the lower electrode 113 from the second high frequency power supply 160. Accordingly, plasma of the processing gas is generated by the high frequency power for plasma generation, and a self bias potential is generated on the wafer W (susceptor 114) by the high frequency bias power. Thus, an electric field of a plasma sheath caused by a plasma potential and a wafer potential (susceptor potential) is formed on the wafer W, so that ions in the plasma can be attracted to the wafer W. Accordingly, the process (etching process or film formation process) can be performed on the wafer W.

At this time, the electric field of the plasma sheath is also formed on the focus ring 210 due to a top surface electric potential thereof. Accordingly, by adjusting the top surface electric potential of the focus ring 210 by the focus ring device 200, the periphery of the wafer W can be uniformly processed as well as the center thereof.

(Configuration Example of Focus Ring Device)

Hereinafter, a focus ring device 200 of the present embodiment will be described. The focus ring device 200 may include a conductive focus ring 210 disposed to surround the wafer W mounted on the electrostatic chuck 115. A dielectric ring 220 is positioned between the focus ring 210 and the susceptor 114. That is, the dielectric ring 220 is disposed to surround an upper portion and a side portion of a periphery of the susceptor 114, and the focus ring 210 is positioned on the dielectric ring 220.

The focus ring 210 is made of a conductive material such as Si (Si doped with B (boron) for conductivity) or C, SiC. The dielectric ring 220 is made of a dielectric material, e.g., quartz, ceramic such as alumina, or a resin such as Bespel (Registered Trademark).

The focus ring 210 may include an outer ring 214 and an inner ring 212 formed as a single member. The inner ring may extend inwardly from the outer ring 214 and has a height different from the outer ring 214. A top surface 215 of the outer ring 214 is higher than the top surface of the wafer W, and a top surface 213 of the inner ring 212 is lower than the bottom surface of the wafer W. The outer ring 214 is spaced apart from the outer periphery of the wafer W so as to surround the circumference thereof. The inner ring 212 is spaced apart from the lower periphery of the wafer W.

In FIG. 1, the inner ring 212 and the outer ring 214 are formed as a single member and electrically connected with each other. The inner ring 212 and the outer ring 214 are electrically insulated from the susceptor 114 by the dielectric ring 220. Since the focus ring 210 (including the outer ring 214 and the inner ring 212) is in electrical contact with only the dielectric ring 220, the focus ring 210 is in an electrically floating state (insulating state) with respect to a ground potential (ground). In the floating state, a potential difference is generated between the focus ring 210 and the susceptor 114 (the wafer W) so that deposits adhering to the periphery of the wafer W may be reduced.

A ring-shaped grounding body 230 is provided at an outside of the dielectric ring 220 and below the focus ring 210. The grounding body 230 is grounded and constantly maintained at a ground potential. A gap is formed between a top surface of the grounding body 230 and a bottom surface of the focus ring 210 in order to prevent contact therebetween. Outer peripheries of the focus ring 210 and the dielectric ring 220 are surrounded by an insulating member 240. Here, an upper portion of the insulating member 240 may be configured as a cover ring.

If a slanted surface that is gradually lowered inwardly (toward the wafer W side) is formed at an inner periphery of the top surface 215 of the outer ring 214, the top surface 215 of the outer ring 214 has an outer horizontal surface and an inner slanted surface. Hence, variation of a sheath thickness at the boundary on the outer ring 214 and the wafer W can be reduced.

Meanwhile, in the present embodiment, when the focus ring 210 is in the floating state by the dielectric ring 220 positioned below the focus ring 210, the top surface electric potential of the focus ring 210 varies depending on, e.g., a distance between the susceptor 114 and the focus ring 210 or a type of substrate. This may affect the process at the periphery of the wafer W or the deposit etching process.

Therefore, in the focus ring device 200 of the present embodiment, a dielectric constant varying device 250 for varying a dielectric constant of the dielectric ring 220 is provided to adjust the dielectric constant thereof without exchanging the dielectric ring 220. That is, by adjusting the dielectric constant of the dielectric ring 220 by the dielectric constant varying device 250, the impedance between the susceptor 114 and the focus ring 210 can be controlled. Accordingly, it is possible to prevent the voltage from being not uniformly applied to the periphery of the wafer W, and it is possible to control the top surface electric potential of the focus ring 210 to a desired value.

By way of example, the dielectric constant varying device 250 may be configured as a conductor elevation device for vertically moving a conductor within a space formed in the dielectric ring 220. With this configuration, by moving the conductor toward or away from the focus ring 210 in the vicinity of the susceptor 114, the dielectric constant of the dielectric ring 220 can be adjusted. Accordingly, the top surface electric potential of the focus ring 210 can be adjusted.

Figure 2:
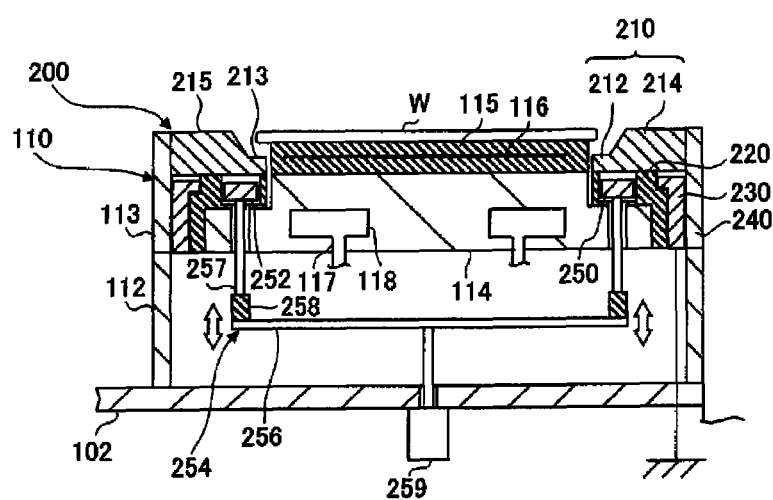
FIG. 2 is a cross sectional view illustrating a specific configuration example of a focus ring device of the present embodiment and explains a configuration example of a dielectric constant varying device.
Figure 3:
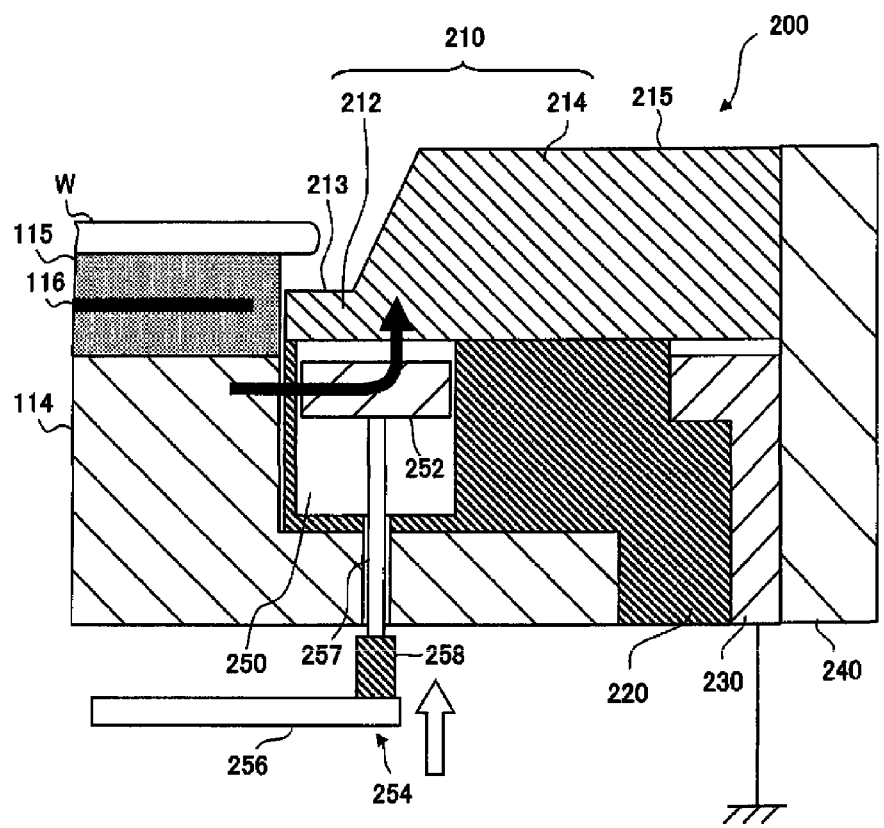
FIG. 3 is an operation explanatory view of the focus ring device shown in FIG. 2 when moving up a conductor.
Figure 4:
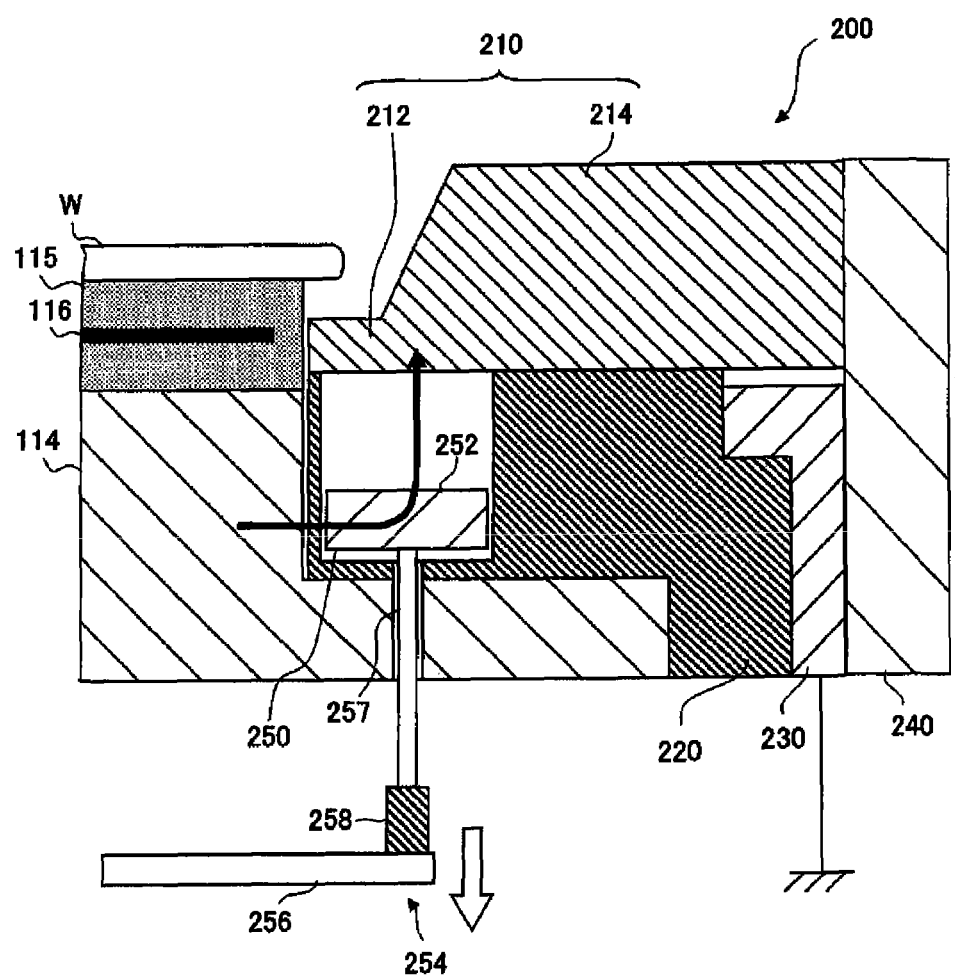
FIG. 4 is an operation explanatory view of the focus ring device shown in FIG. 2 when moving down the conductor.

Hereinafter, a specific example of the focus ring device 200 including the dielectric constant varying device 250 will be described with reference to the drawings. FIG. 2 is a cross sectional view illustrating a specific configuration example of the focus ring device 200 of the present embodiment and explains a configuration example of the dielectric constant varying device 250. FIG. 3 is a diagram for explaining an operation of the focus ring device shown in FIG. 2 in a case of moving up the conductor. FIG. 4 is a diagram for explaining an operation of the focus ring device shown in FIG. 2 in a case of moving down the conductor. FIGS. 3 and 4 provide enlarged views of the configuration near the focus ring 210 shown in FIG. 2.

In the dielectric constant varying device 250 shown in FIG. 2, a ring-shaped conductor 252 is provided within a ring-shaped space formed in the dielectric ring 220 in the vicinity of the susceptor 114 so as to be vertically moved by a conductor driving device 254. The conductor 252 is made of a conductive material such as aluminum.

Further, in the dielectric constant varying device 250 shown in FIG. 2, an upper portion of the space formed in the dielectric ring 220 may be opened, so that the conductor 252 can be moved up until it is in direct contact with the bottom surface of the focus ring 210. Alternatively, the upper portion of the space formed in the dielectric ring 220 may be closed in order to prevent direct contact between the conductor 252 and the bottom surface of the focus ring 210.

Specifically, as shown in FIG. 2, by way of example, the conductor driving device 254 may include a vertically movable base 256, a multiple number of (e.g., three) supports 257 for supporting the conductor 252 from the bottom, and a motor 259 for vertically moving the base 256 connected by a rod such as a ball screw.

With this configuration, as shown in FIG. 3, when the conductor 252 is moved up toward the focus ring 210 by the conductor driving device 254, for example, a current flowing from the susceptor 114 toward the focus ring 210 via the conductor 252 is increased within the dielectric ring 220. That is, an impedance of the dielectric ring 220 is apparently decreased, and, thus, the dielectric constant of the dielectric ring 220 is increased.

In this case, as the conductor 252 is moved up, the current flowing from the susceptor 114 toward the focus ring 210 via the conductor 252 is increased, and the dielectric constant of the dielectric ring 220 can be increased accordingly. As a result, the top surface electric potential of the focus ring 210 can be increased to a level close to the potential of the susceptor 114.

Meanwhile, when the conductor 252 is moved away from the focus ring 210 by moving down the conductor 252 by the conductor driving device 254 as shown in FIG. 4, the current flowing from the susceptor 114 toward the focus ring 210 via the conductor 252 is decreased in the dielectric ring 220. That is, the apparent impedance of the dielectric ring 220 is increased, and the dielectric constant of the dielectric ring 220 is decreased.

As the conductor 252 is moved down, the current flowing from the susceptor 114 toward the focus ring 210 via the conductor 252 is decreased, and the dielectric constant of the dielectric ring 220 can be decreased accordingly. As a result, the top surface electric potential of the focus ring 210 can be decreased.

As described above, in accordance with the focus ring device 200 shown in FIG. 2, by moving up the conductor 252 by the dielectric constant varying device 250, the top surface electric potential of the focus ring 210 can be set to a level close to the potential of the susceptor 114. At this time, as the conductor 252 is moved up, the current may easily flow from the susceptor 114 toward the focus ring 210 via the conductor 252, whereas the current may hardly flow from the wafer W toward the focus ring 210.

Hence, the top surface electric potential of the focus ring 210 is hardly affected by the resistance of the wafer W. As a result, it is possible to prevent the processing rate from being decreased due to the non-uniformity of the voltage (high frequency bias voltage (Vpp)) applied to the periphery of the wafer, so that the processing rate can be enhanced.

As shown in FIG. 2, when the conductor 252 is supported by the supports 257, even if the current flows from the susceptor 114 toward the conductor 252 the current may be prevented from being leaked to the conductor driving device 254 via the supports 257. By way of example, when the supports 257 as well as the conductor 252 are made of a conductive material such as aluminum, an insulating body 258 may be positioned between each of the supports 257 and the base 256, as can be seen from FIG. 2.

Accordingly, the current flowing toward the conductor 252 from the susceptor 114 can flow toward the focus ring 210 without being leaked to the base 256 via the supports 257. Further, instead of the configuration shown in FIG. 2, by way of example, the supports 257 may be made of an insulating material, or the base 256 may be made of an insulating material.

Figure 5:
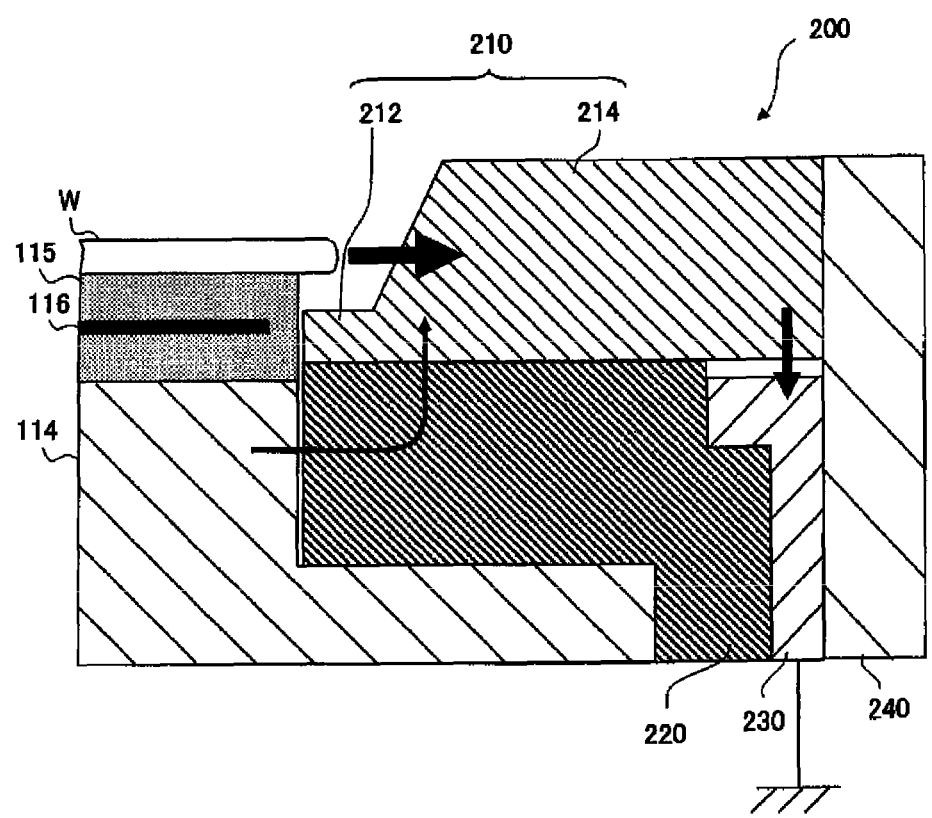
FIG. 5 is a partial cross sectional view for explaining an effect of a focus ring in accordance with a comparative example.
Figure 6:
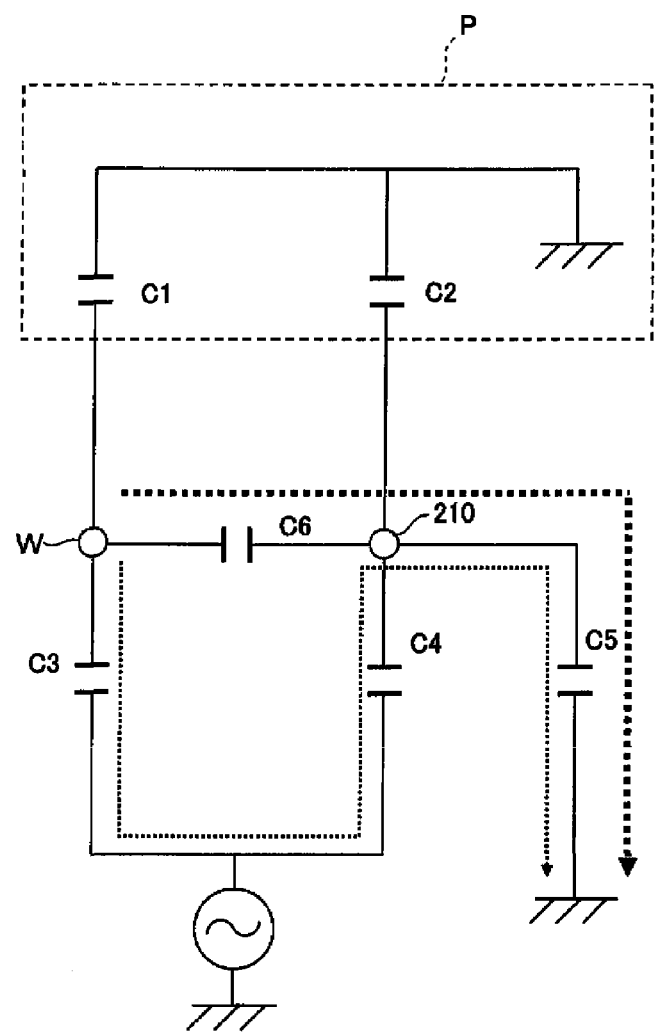
FIG. 6 illustrates an equivalent circuit of the focus ring shown in FIG. 5.
Figure 7:
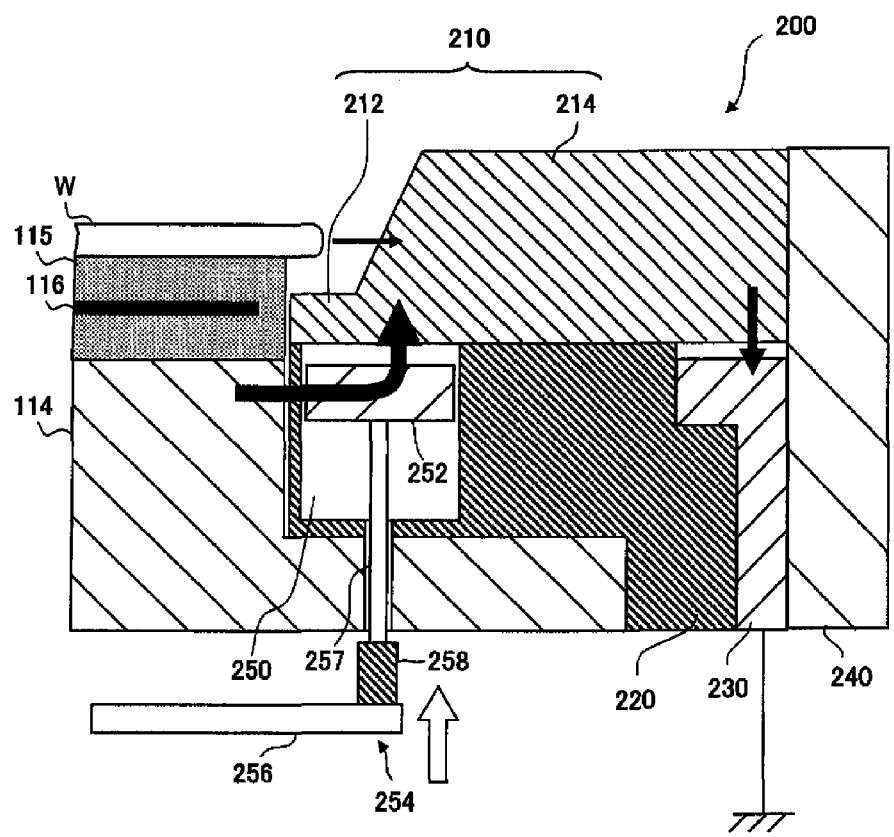
FIG. 7 is a partial cross sectional view for explaining an effect of the focus ring device shown in FIG. 2.

Hereinafter, in the focus ring device 200 of FIG. 2, the position and the effect of the conductor 252 by the dielectric constant varying device 250 will be described in detail in comparison with a focus ring without having the dielectric constant varying device 250. FIG. 5 is a partial cross sectional view for explaining the effect of the focus ring device 200 in accordance with a comparative example without having the dielectric constant varying device 250. FIG. 6 illustrates an equivalent circuit of the focus ring device 200 in accordance with the comparative example shown in FIG. 5. FIG. 7 is a partial cross sectional view for explaining the effect of the focus ring device 200 in accordance with the present embodiment having the dielectric constant varying device 250.

As illustrated in FIG. 5, when the dielectric constant varying device 250 is not provided, the distance between the focus ring 210 and the susceptor 114 may become increased as the thickness of the electrostatic chuck 115 is increased. Therefore, when plasma is generated, the current may hardly flow from the susceptor 114 toward the focus ring 210, whereas the current may easily flow from the wafer W toward the focus ring 210.

This will be described in detail with reference to the equivalent circuit shown in FIG. 6. In the equivalent circuit shown in FIG. 6, C1 indicates an electrostatic capacitance between plasma P and the wafer W; C2 indicates an electrostatic capacitance between the plasma P and the focus ring 210; C3 indicates an electrostatic capacitance associated with the wafer W, the electrostatic chuck 11 and the susceptor; C4 indicates an electrostatic capacitance between the focus ring 210 and the dielectric ring 220; C5 indicates an electrostatic capacitance between the focus ring 210 and the grounding body 230; and C6 indicates an electrostatic capacitance between the wafer W and the focus ring 210.

Referring to FIG. 6, as the distance between the focus ring 210 and the susceptor 114 is increased, the current may hardly flow along a route passing through the electrostatic capacitances C3, C4 and C5 (the susceptor 114→the dielectric ring 220→the focus ring 210→the grounding body 230), whereas the current may easily flow along a route passing through the electrostatic capacitances C6 and C5 (the susceptor 114→the wafer W→the focus ring 210→the grounding body 230).

As described above, if the current easily flows from the wafer W toward the focus ring 210, the top surface electric potential of the focus ring 210 affects the difference in the resistance of the wafer W due to the surface structure of the wafer W. That is, different types of the wafers W have different resistances, so that the current flowing in the focus ring 210 becomes non-uniform. For this reason, the voltage (high frequency bias voltage (Vpp)) applied to the wafer W varies with, e.g., a type of wafer W, and the top surface electric potential of the focus ring 210 is decreased. As a result, there is a problem that the processing rate at the periphery of the wafer W may be decreased.

In accordance with the present embodiment, the above-described problems can be solved by controlling the dielectric constant varying device 250. Specifically, these problems may be solved by controlling the dielectric constant of the dielectric ring 220 by moving up the conductor 252 toward the focus ring 210 through the use of the dielectric constant varying device 250 as shown in FIG. 7. Accordingly, the current can easily flow from the susceptor 114 toward the focus ring 210 via the conductor 252. That is, the electrostatic capacitance C4 shown in FIG. 6 can be controlled by adjusting the dielectric constant of the dielectric ring 220. Therefore, the current can easily flow in the route passing through the electrostatic capacitances C3, C4 and C5. On the other hand, the current flowing in the route passing through the electrostatic capacitances C6 and C5 can be suppressed. As a result, it is possible to prevent the current from flowing from the wafer W toward the focus ring 210.

Therefore, even when the type of wafer W is changed, the voltage (high frequency bias voltage (Vpp)) applied to the wafer W can be uniform. Hence, it is possible to reduce the decrease in the processing rate at the periphery of the wafer W.

Since, however, different wafers W have different resistances as described above, the current flowing from the wafer W toward the focus ring 210 is also changed. For this reason, the position of the conductor 252 may be adjusted depending on the type of wafer W such that the current flowing from the wafer W toward the focus ring 210 becomes reduced. As a result, it is possible to effectively prevent the voltage (high frequency bias voltage (Vpp)) applied to the wafer W from being non-uniform, and also possible to effectively reduce the decrease in the processing rate at the periphery of the wafer W.

In this case, an optimal position of the conductor 252 for each type of wafer W is previously stored as potential adjusting data in the storage unit 420. Then, when the wafer W is processed, by reading out the adjusting data from the storage unit 420 based on the type of wafer W, the dielectric constant varying device 250 is driven to automatically control the position of the conductor 252.

In the present embodiment, as the conductor 252 becomes close to the focus ring 210, the top surface electric potential of the focus ring 210 can becomes close to the potential of the susceptor 114. This may allow active species such as ions to be easily attracted toward the focus ring 210. Therefore, the processing rate at the periphery of the wafer W can be further improved.

In the dielectric constant varying device 250 shown in FIG. 2, the vertically movable conductor is provided within the dielectric ring 220, but is not limited thereto. That is, instead of the above-mentioned example, in the dielectric constant varying device 250, fluid (liquid or gas) having dielectric properties may be introduced into the dielectric ring 220.

Figure 8:
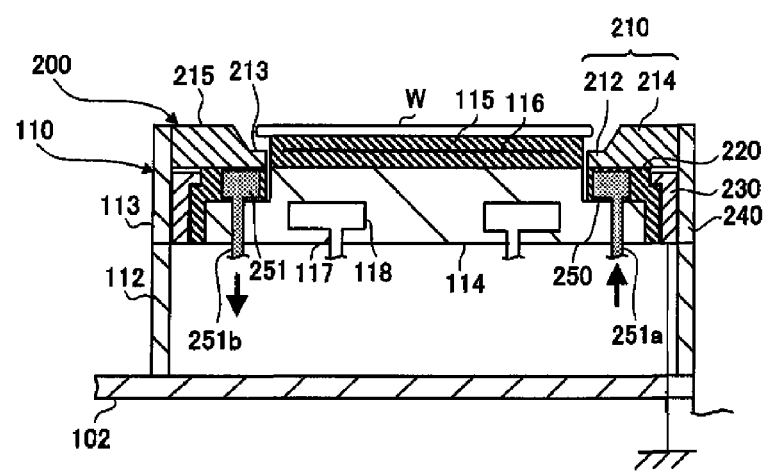
FIG. 8 is a cross sectional view illustrating another configuration example of a dielectric constant varying device in the focus ring device of the present embodiment.
Figure 9:
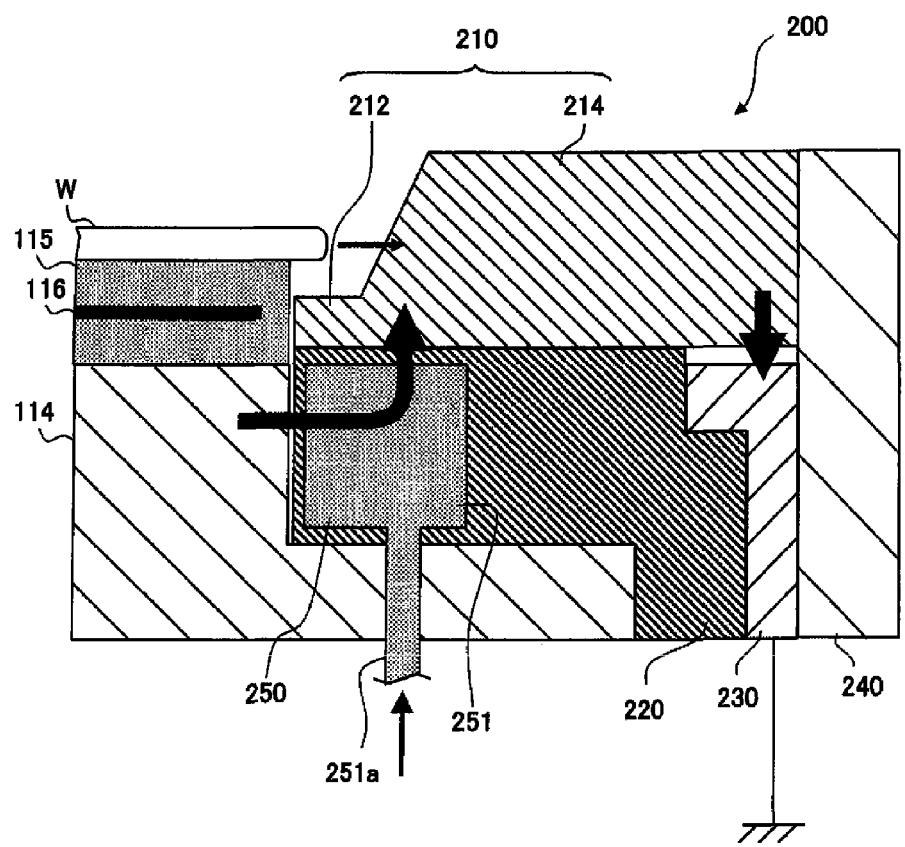
FIG. 9 is an operation explanatory view of the focus ring device shown in FIG. 8.

By way of example, when a dielectric fluid in a liquid phase is used, the dielectric constant of the dielectric ring 220 can be adjusted by circulating the dielectric fluid through a ring-shaped fluid path 251 formed in the dielectric ring 220 as shown in FIG. 8. Specifically, the dielectric fluid may be circulated in the fluid path 251 of FIG. 8 by being introduced into the fluid path 251 via an inlet line 251a, and then by being discharged from a discharge line 251b.

As the dielectric fluid in a liquid phase, methanol, acetone, benzene or nitrobenzene may be used. Dielectric constant may be different depending on a type of a dielectric fluid. By way of example, ethanol, methanol and acetone have dielectric constants of about 24.3, 32.6, and 20.7, respectively. Therefore, the dielectric constant of the dielectric ring 220 can be adjusted by changing the kind of dielectric fluid circulating through the fluid path 251. By way of example, the dielectric constant of the dielectric ring 220 can be increased by circulating methanol having a relatively high dielectric constant through the fluid chamber 251.

With this configuration, the dielectric constant of the dielectric ring 220 may be increased by circulating a certain dielectric fluid through the dielectric path 251. As a result, the current can easily flow from the susceptor 114 toward the focus ring 210 via the conductor 252, whereas the current can be suppressed to flow from the wafer W toward the focus ring 210.

Accordingly, regardless of types of wafers W, it is possible to prevent the top surface electric potential of the focus ring 210 from being decreased. As a result, it is possible that the voltage (high frequency bias voltage (Vpp)) is uniformly applied to the wafer W, and that the processing rate at the periphery of the wafer W is improved.

When a dielectric fluid in a gas phase is used, the dielectric fluid is introduced from a gas supply source under a certain pressure via a pressure control valve such as a PCV valve. In this case, the dielectric constant of the dielectric ring 220 can also be adjusted.

(Modification of Focus Ring Device)

A modification of the focus ring device 200 will be described with reference to the drawings. In the example shown in FIG. 2, the top surface electric potential of the focus ring 210 may be adjusted by moving the conductor 252 toward or away from the focus ring 210 within the dielectric ring 220. Further, the top surface electric potential of the focus ring 210 may also be adjusted by controlling the current flowing from the focus ring 210 toward the ground potential by moving the grounding body 230 toward or away from the focus ring 210. Therefore, hereinafter, the focus ring device 200 having configuration capable of vertically moving the grounding body 230 as well as the conductor 252 will be described.

Figure 10:
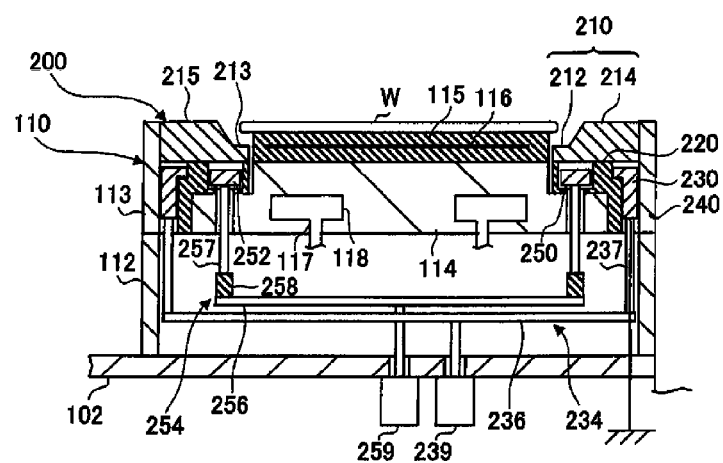
FIG. 10 is a cross sectional view showing a modified configuration of the focus ring device in accordance with the embodiment of the present disclosure.
Figure 11:
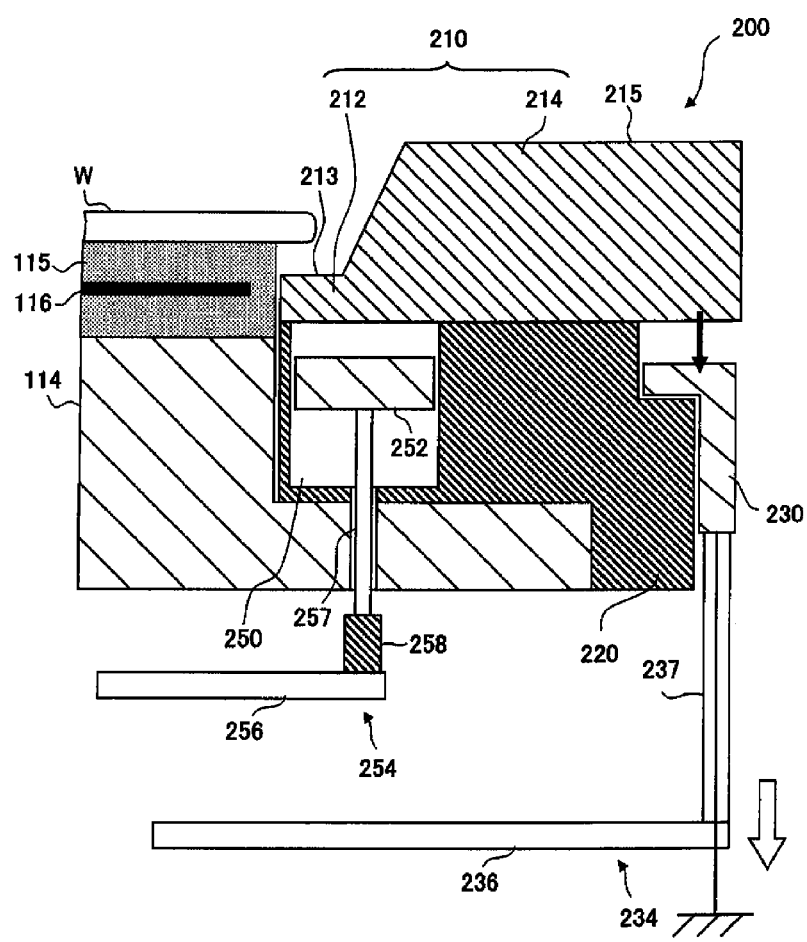
FIG. 11 is an operation explanatory view of the focus ring device shown in FIG. 10 when moving down a grounding body.
Figure 12:
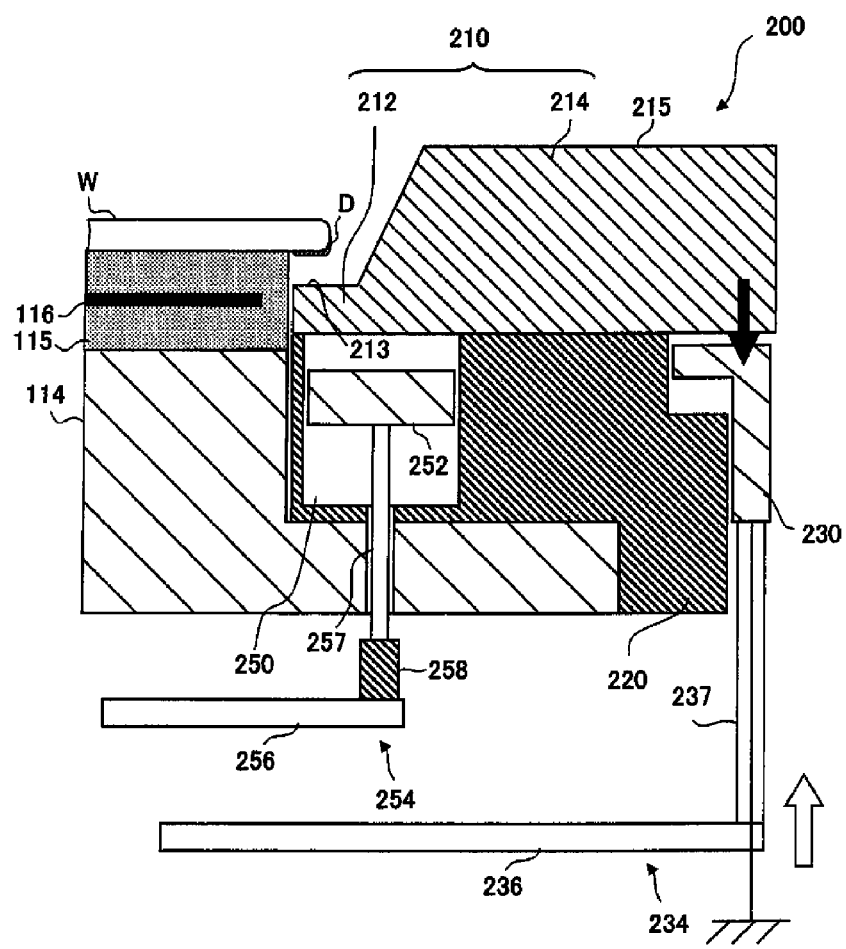
FIG. 12 is an operation explanatory view of the focus ring device shown in FIG. 10 when moving up the grounding body.

FIG. 10 is a cross sectional view showing modified configuration of the focus ring device 200 in accordance with the present embodiment, and the grounding body 230 of the focus ring device 200 shown in FIG. 2 is vertically movable in the modified configuration. FIG. 11 is an operation explanatory view of the focus ring device shown in FIG. 10 when moving down the grounding body. FIG. 12 is an operation explanatory view of the focus ring device shown in FIG. 10 when moving up the grounding body.

The grounding body 230 shown in FIG. 10 may be vertically moved by a grounding body elevation device 234 while the grounding body 230 is grounded, and a gap between the grounding body 230 and the focus ring 210 may be adjusted. Specifically, as shown in FIG. 10, by way of example, the grounding body elevation device 234 may include a vertically movable base 236, a multiple number of (e.g., three) supports 237 for supporting the grounding body 230, and a motor 239 for vertically moving the base 236 connected by a rod such as a ball screw.

With this configuration, as shown in FIG. 11, if the grounding body 230 is spaced apart from the focus ring 210 by moving down the grounding body 230 by the grounding body elevation device 234, the gap therebetween is increased. As a result, the current flowing from the focus ring 210 toward the grounding body 230 is decreased.

In this case, the current flowing from the focus ring 210 toward the grounding body 230 may become decreased as the grounding body 230 is lowered. Hence, the focus ring 210 may be in an approximately floating state. If the position of the conductor 252 is adjusted in this state, the top surface electric potential of the focus ring 210 can be maintained depending on the position of the conductor 252.

On the other hand, as illustrated in FIG. 12, if the grounding body 230 is moved up toward the focus ring 210 by the grounding body elevation device 234, the gap therebetween is decreased. As a result, the current flowing from the focus ring 210 toward the grounding body 230 may be increased.

In this case, the current flowing from the focus ring 210 toward the grounding body 230 may become increased as the grounding body 230 is moved up. Thus, the top surface electric potential of the focus ring 210 can be decreased up to a substantially ground potential. That is, without changing the position of the conductor 252, the top surface electric potential of the focus ring 210 may be decreased by moving up the grounding body 230.

If the grounding boy 230 is moved up until it comes in contact with the focus ring 210, the top surface electric potential of the focus ring 210 may be decreased up to the ground potential. Accordingly, in order to avoid the decrease of the top surface electric potential of the focus ring 210, the grounding body 230 may be moved up to a level of not being contacted with the focus ring 210.

As described above, in accordance with the focus ring device 200 shown in FIG. 10, the top surface electric potential of the focus ring 210 may be controlled by adjusting either the position of the grounding body 230 or the position of the conductor 252 of the dielectric constant varying device 250. That is, by moving the grounding body 230 toward the focus ring 210, the top surface electric potential of the focus ring 210 can be decreased from the potential in the floating state to a desired potential (up to approximately ground potential) without changing the position of the conductor 252.

Accordingly, when the deposit etching process for etching deposits at the periphery of the wafer W is performed, for example, a large potential difference between the wafer W (susceptor 114) and the focus ring 210 may be generated by moving the grounding body 230 toward the focus ring 210. As a result, it is possible to increase the processing rate of the deposit etching process.

Figure 13:
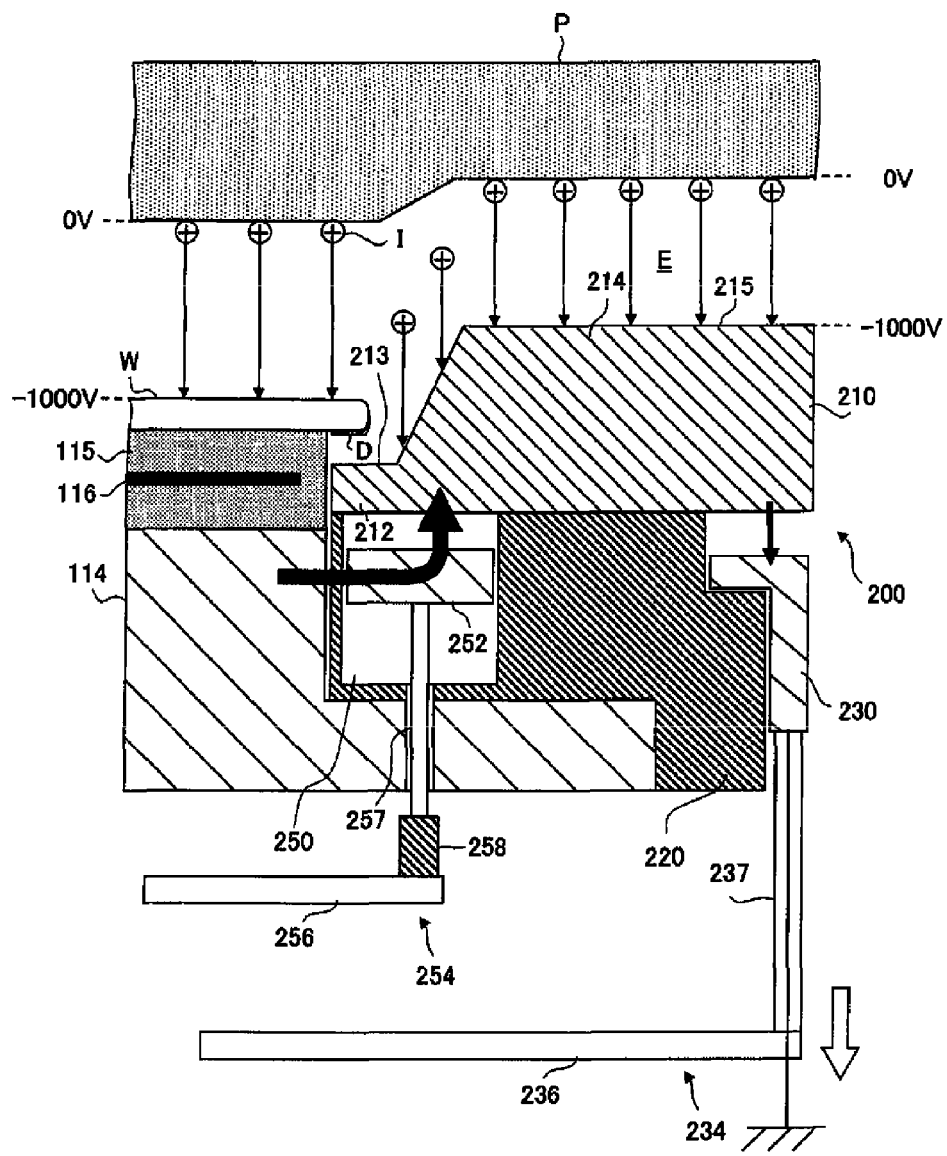
FIG. 13 is a diagram for describing an operation and effect of the focus ring illustrated in FIG. 10 and shows when moving down the grounding body.
Figure 14:
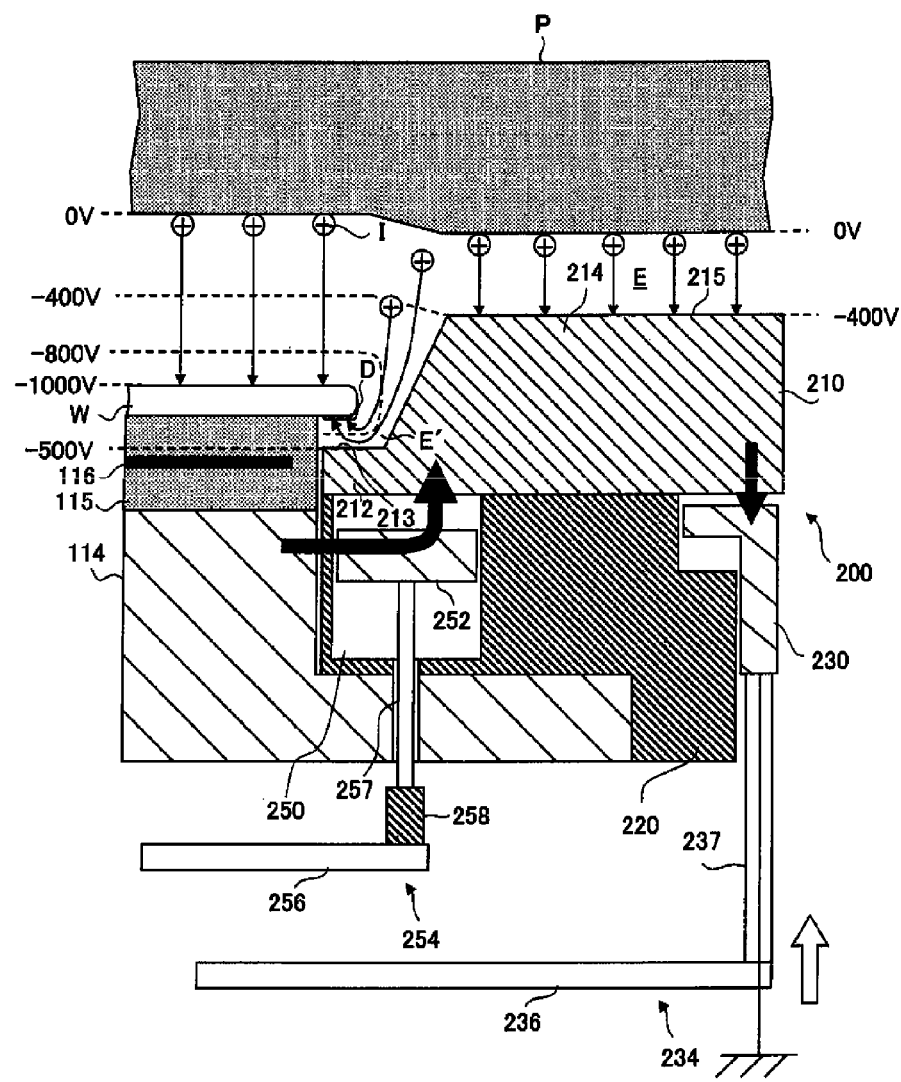
FIG. 14 is a diagram for describing an operation and effect of the focus ring device illustrated in FIG. 10 and shows when moving up the grounding body.

Hereinafter, the position and the effect of the grounding body 230 of the focus ring device 200 shown in FIG. 10 will be described with reference to the drawings. FIGS. 13 and 14 explain the effect of the focus ring device 200 shown in FIG. 10, and FIGS. 13 and 14 show a case where the position of the grounding body 230 is changed while the conductor 252 is fixed to a certain position (i.e., without adjusting the position of the conductor 252). FIG. 13 shows when moving down the grounding body 230 and FIG. 14 shows when moving up the grounding body 230.

As shown in FIG. 13, when the grounding body 230 is moved down, the focus ring 210 becomes the substantially floating state. At this time, if the potential of the susceptor 114 (potential of the wafer W) is, e.g., about −1000 V during a plasma process, the position of the conductor 252 may be adjusted such that the top surface electric potential of the focus ring 210 becomes close thereto.

In the example shown in FIG. 13, an electric field E of a plasma sheath is generated between the plasma P and the top surface of the wafer W and between the plasma P and the top surface of the focus ring 210. At this time, the thickness of the plasma sheath above a portion ranging from the top surfaces of the wafer W and the focus ring 210 becomes substantially uniform.

Due to the electric field E, ions I are attracted from the plasma P to the top surface of the wafer W and to the top surface of the focus ring 210 in a substantially vertical direction. Therefore, the ions I moving toward the vicinity of the periphery of the wafer W are also attracted in a substantially vertical direction. Further, since there is no potential difference between the wafer W and the focus ring 210, even if the ions I are introduced to a gap between the wafer periphery and the focus ring 210, it is difficult for the ions I to reach a side surface or a rear surface of the wafer periphery. For this reason, deposits (deposition) D such as polymer may be easily deposited on the side surface or the bottom surface (rear surface) of the wafer periphery.

Meanwhile, when the grounding body 230 is moved up as shown in FIG. 14, the current flowing from the focus ring 210 toward the grounding body 230 is increased. As a result, the top surface electric potential of the focus ring 210 is decreased. At this time, if the position of the grounding body 230 is adjusted such that the top surface electric potential of the focus ring 210 becomes, e.g., about −400 V, the top surface electric potentials of the inner ring 212 and the outer ring 214 also becomes about −400 V.

Accordingly, a large potential difference (about 600 V in this example) may be generated between the focus ring 210 (including the inner ring 212 and the outer ring 214) and the wafer W (the susceptor 114), and this results in the generation of an electric field E'. As indicated by dotted lines in FIG. 14, equipotential surfaces of the electric field E' are formed between an outer peripheral surface of the wafer W and an inner peripheral surface of the outer ring 214 in a substantially vertical direction. This may allow the ions I to move from an outer peripheral surface of the outer ring 214 toward an outer peripheral surface of the wafer periphery. Further, equipotential surfaces are formed between the bottom surface of the wafer periphery and the top surface 213 of the inner ring 212 in a substantially horizontal direction. This may allow the ions I to move from the top surface 213 of the inner ring 212 toward the rear surface of the periphery of the wafer W.

Due to the effect of the electric field E', some of the ions I moving from the plasma P toward the periphery of the wafer W may collide with the outer peripheral surface of the wafer periphery. Further, other ions I entering a gap between the outer peripheral surface of the wafer periphery and the inner peripheral surface of the outer ring 214 may be accelerated and may collide with the bottom surface (rear surface) of the wafer periphery. Therefore, the ions I in the plasma can collide with the side surface or the bottom surface (rear surface) of the wafer periphery as well as the top surface thereof.

At this time, as the potential difference between the focus ring 210 (including the inner ring 212 and the outer ring 214) and the wafer W (the susceptor 114) is increased, the ions I colliding with the wafer periphery can be increased and accelerated. As a result, the processing rate of the deposit etching process for etching the deposits D from the side surface and the bottom surface (rear surface) of the wafer periphery can be increased.

(Specific Example of Top Surface Electric Potential Control of Focus Ring)

Figure 15:
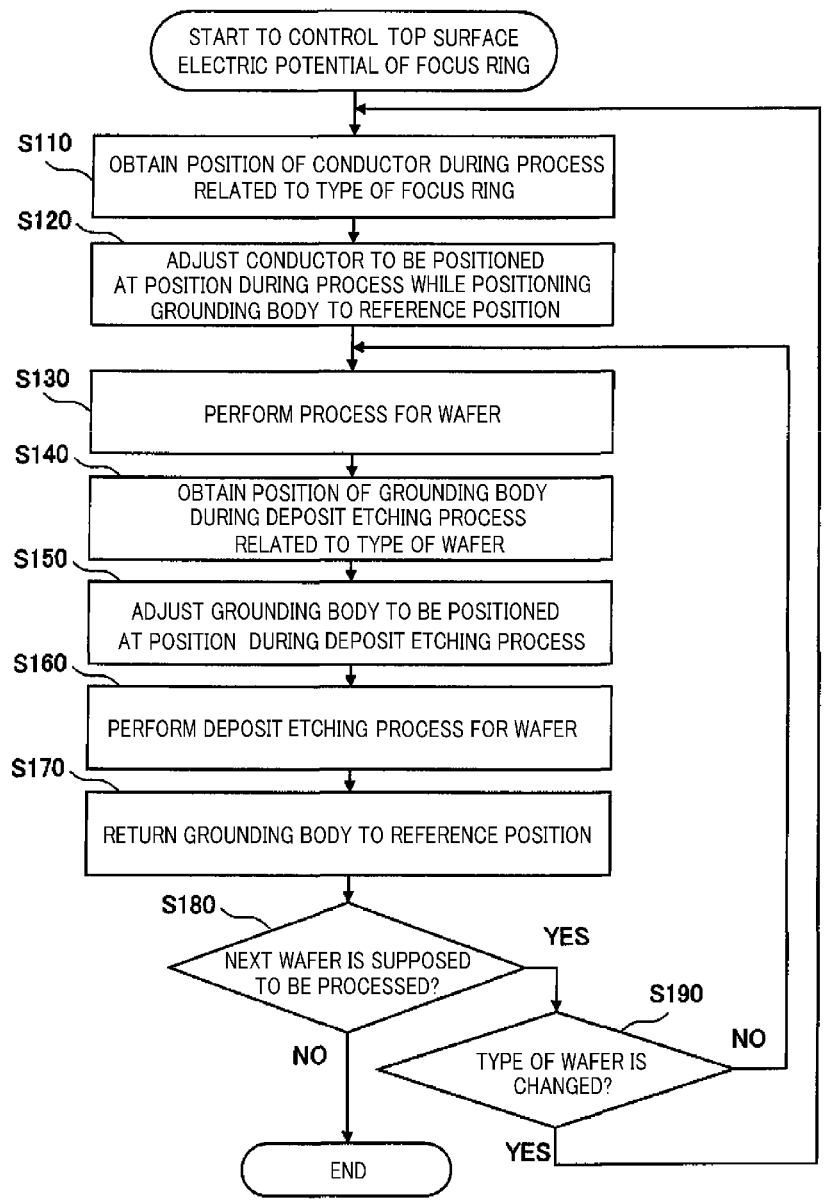
FIG. 15 is a flowchart schematically showing a sequence for controlling a top surface electric potential of a focus ring by using the focus ring device shown in FIG. 10.

Hereinafter, a specific example of a top surface electric potential control of the focus ring 210 by the focus ring device 200 shown in FIG. 10 will be described with reference to the drawing. FIG. 15 is a flowchart schematically showing a sequence for controlling the top surface electric potential of the focus ring. In this example, after the wafer W is processed while adjusting the position of the conductor 252, a process of etching the deposits from the wafer W is consecutively performed while adjusting the position of the grounding body 230.

First of all, in processes S110 and S120, when the wafer W as a target object is processed, the position of the conductor 252 is adjusted depending on the type of wafer W. That is, in process S110, a position of the conductor 252 during the process is obtained from the top surface electric potential control data shown in FIG. 16. The position of the conductor 252 may be related to the type of wafer W as a target object. In process S120, the conductor 252 is positioned at the obtained position so as to increase the top surface electric potential of the focus ring 210 (up to a level close to the potential of the susceptor 114).

At this time, the grounding body 230 is moved down to a reference position (e.g., a position of the grounding body 230 shown in FIG. 13) which is most distant from the focus ring 210. Accordingly, it is possible to suppress the current from leaking through the grounding body 230 from the focus ring 210. As a result, the top surface electric potential of the focus ring 210 related to the position of the conductor 252 can be maintained.

In order to obtain the process position of the conductor 252, by way of example, during plasma generation, a position of the conductor 252 when the current flowing toward the focus ring 210 from the wafer W has a minimum value is previously measured for each type of wafer W. Then, the measured position is stored in the storage unit 420 as top surface electric potential control data shown in FIG. 16. In process S110, when obtaining the position of the conductor 252, the position of the conductor 252 during the process, which is related to the type of wafer, is obtained from the top surface electric potential control date. Referring to example shown in FIG. 16, when the type of wafer W is X, the position of the conductor 252 during the process is $A_x$ (e.g., the position of the conductor 252 shown in FIG. 13).

As described above, after the position of the conductor 252 is adjusted, the wafer W is processed in process S130. Accordingly, regardless of types of wafers W, it may be possible to suppress the decrease in the top surface electric potential of the focus ring. As a result, it is possible to improve the processing rate at the periphery of the wafer W.

Thereafter, in processes S140 and S150, when the deposit etching process is performed on the wafer W as a target object, the position of the grounding body 230 is adjusted depending on the type of wafer W. That is, in process S140, a position of the grounding body 230 during the deposit etching process is retrieved from the top surface electric potential control data shown in FIG. 16. The position of the grounding body 230 is associated with the type of wafer. In process 150, the grounding body 230 is positioned at the retrieved position so as to decrease the top surface electric potential of the focus ring 210 (up to a level close to the ground potential).

At this time, it is desirable to locate the conductor 252 at the position of the conductor 252 during the process. In this way, when the same type of wafer W is processed, it is unnecessary to adjust the position of the conductor 252 again. Moreover, without adjusting the position of the conductor 252, the top surface electric potential of the focus ring 210 can be sufficiently decreased by moving the grounding body 230 toward the focus ring 210.

In order to obtain the position of the grounding body 230 during the deposit etching process, by way of example, a position of the grounding body 230 when an etching rate for deposits adhering to the periphery of the wafer W is increased is previously measured for each type of wafer. Then, the measured position is stored in the storage unit 420 as the top surface electric potential control data shown in FIG. 16. In process S140, when obtaining the position of the grounding body 230, the position of the grounding body 230 during the process, which is related to the type of wafer W, is obtained from the top surface electric potential control data. Referring to the example shown in FIG. 16, when the type of wafer W is X, the position of the grounding body 230 during the process is Bx (e.g., the position of the grounding body 230 shown in FIG. 14).

After the position of the grounding body 230 is adjusted, the deposit etching process for the wafer W is performed in process 5160. Accordingly, since the potential difference between the focus ring 210 and the wafer W can be increased, it is possible to improve the processing rate of the deposit etching process.

Upon completion of the deposit etching process in process 5160, in process 5170, the grounding body 230 is returned to the original reference position in order to prepare a process for a next wafer W. Next, in process S180, it is determined whether a process is performed on the next wafer W or not. If it is determined that the process is not performed on the next wafer W, a series of processes of controlling the top surface electric potential of the focus ring is completed. On the contrary, if it is determined that a process is performed on the next wafer W in process S180, it is determined whether the type of wafer W is changed or not in process S190.

In process S190, if it is determined that the type of wafer W is not changed, the process returns to process S130. That is, the process is performed without changing the position of the conductor 252 because the type of wafer W is not changed.

On the other hand, if it is determined that the type of wafer W is changed in process S190, the process returns to process S110. That is, since the type of wafer W is changed, the position of the conductor 252 is changed depending on a new type of wafer W in processes S110 and S120. Then, process S130 is performed.

As described above, the position of the conductor 252 may be adjusted only when the type of wafer W is changed. Further, the position of the conductor 252 may not be adjusted if the type of wafer W is not changed. Therefore, throughput for the entire wafer process can be improved.

In the focus ring device 200 of FIG. 10, the focus ring device 200 includes the dielectric constant varying device 250 for vertically moving the conductor 252, and the grounding body 230 of the focus ring device 200 can be vertically moved. However, instead of the above, it may be also possible that the focus ring 200 includes the dielectric constant varying device 250 through which the dielectric fluid in a liquid phase or a gas phase is circulated, and the grounding body 230 can be vertically moved. Moreover, it may also possible that the grounding body 230 of the focus ring device 200 not having the dielectric constant varying device 250 can be vertically moved.

Figure 17:
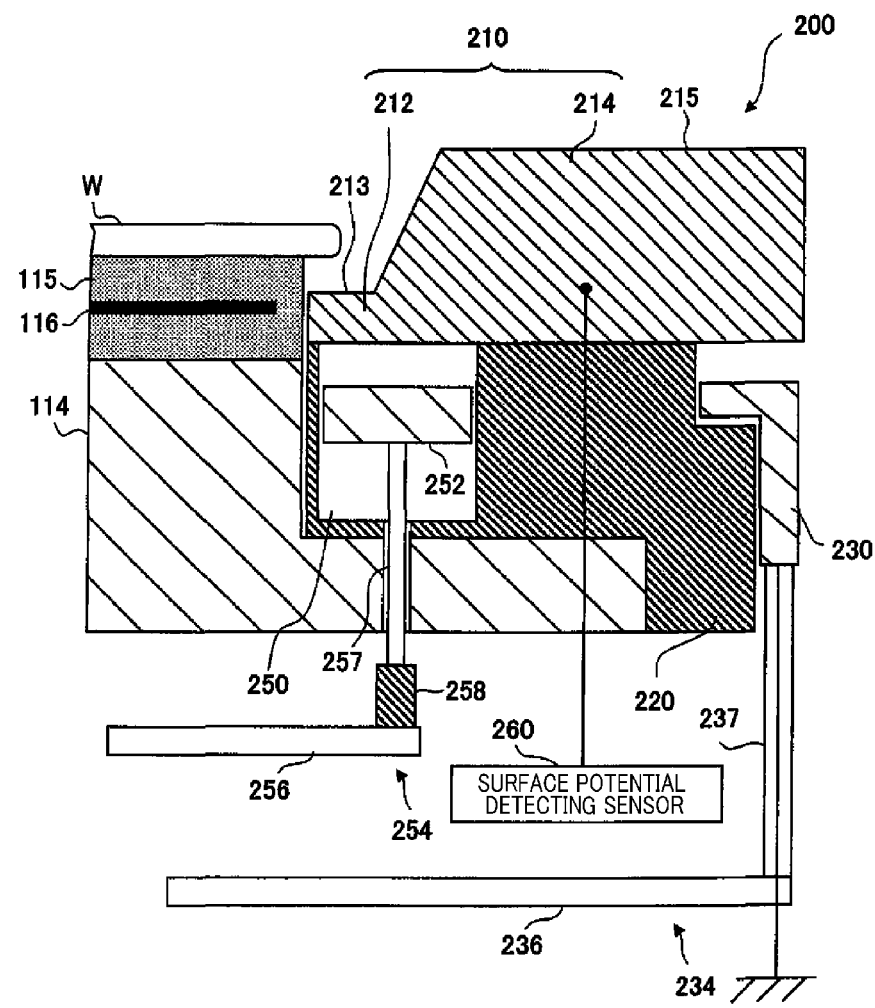
FIG. 17 shows that a surface potential detecting sensor for measuring the top surface electric potential of the focus ring is provided in the focus ring shown in FIG. 10.

Further, the focus ring device 200 of FIG. 10 may include a surface potential detecting sensor 260 for measuring the top surface electric potential of the focus ring 210, as can be seen from FIG. 17. The surface potential detecting sensor 260 may include, e.g., a temperature sensor. Here, a temperature of the focus ring 210 is changed depending on the top surface electric potential thereof. Therefore, by previously measuring and storing the relationship between the temperature and the top surface electric potential of the focus ring 210 in the storage unit 420, the top surface electric potential of the focus ring 210 can be detected based on a measurement value by the temperature sensor.

Hence, the position of the conductor 252 or the grounding body 230 can be adjusted while measuring the top surface electric potential of the focus ring 210 by the surface potential detecting sensor 260. Accordingly, the optimal position of the conductor 252 or the grounding body 230 can be obtained.

Even when the top surface electric potential of the focus ring 210 is changed due to the repetitive processes for the wafer, the potential difference can be corrected by adjusting the position of the conductor 252 or the grounding body 230 by a distance corresponding to the changed potential. Thus, the top surface electric potential of the focus ring 210 can be optimally maintained. Here, when the difference in the top surface electric potential of the focus ring 210 is greater than a certain amount, the focus ring 210 may be promptly exchanged.

The surface potential detecting sensor 260 is not limited to the temperature sensor. By way of example, a deformation sensor for detecting deformation of the focus ring 210 may be used. That is, since the temperature of the focus ring 210 is changed depending on the top surface electric potential of the focus ring 210, the focus ring 210 may be deformed by the temperature. Thus, by previously measuring and storing the relationship between the top surface electric potential and the deformation of the focus ring 210 in the storage unit 420, the top surface electric potential of the focus ring 210 can be obtained based on the measurement value by the deformation sensor. In addition, the surface potential detecting sensor 260 may include a voltmeter capable of directly measuring the potential of the focus ring 210.

While various aspects and embodiments have been described herein, other aspects and embodiments will be apparent to those skilled in the art. The various aspects and embodiments described herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

By way of example, in the above embodiment, although it is described the plasma processing apparatus that applies the high frequency powers to both of the upper electrode and the lower electrode (susceptor), the present disclosure is not limited to the above example. By way of example, the present disclosure may be applied to a plasma process apparatus that applies double high frequency powers having different frequencies only to the lower electrode (susceptor). Further, in the above embodiment, although it is described the plasma processing apparatus that performs the etching process or the film formation process, the present disclosure is not limited thereto. By way of example, the present disclosure may be applied to a plasma processing apparatus that performs other plasma processes such as a sputtering process or a CVD process. Moreover, in the above embodiment, the wafer W is used as the substrate. However, the substrate may not be limited thereto, and may be a FPD substrate, a substrate for a solar cell, or the like.

The present disclosure is applicable to a plasma processing apparatus including a focus ring for surrounding a substrate, a plasma processing method and a storage medium for storing a program for executing the plasma processing method.

What is claimed is:

1. A plasma processing apparatus for performing a plasma process on a substrate by plasma, the apparatus comprising:
a susceptor, having a substrate mounting portion for mounting thereon the substrate, to which a high frequency power is applied;
a focus ring, disposed to surround the substrate mounted on the substrate mounting portion, including an outer ring having a top surface higher than a top surface of the substrate and an inner ring extending inwardly from the outer ring so as to allow at least a part of the inner ring to be positioned below a periphery of the substrate, the outer ring and the inner ring being formed as a single member;
a dielectric ring disposed between the susceptor and the focus ring to surround an upper portion and a side portion of a periphery of the susceptor and configured to insulate the focus ring from the susceptor to maintain the focus ring in an electrically floating state;
a dielectric constant varying device for varying a dielectric constant of the dielectric ring;
a controller for controlling a top surface electric potential of the focus ring by adjusting the dielectric constant of the dielectric ring through the use of the dielectric constant varying device;
a grounding body maintained at a ground potential and positioned between the dielectric ring and an insulating member with a gap formed between a top surface of the grounding body and a bottom surface of the focus ring so as to prevent the grounding body from contacting with the focus ring; and
a grounding body elevation device for moving the grounding body,
wherein the focus ring is insulated from the susceptor by the dielectric ring and maintained in the electrically floating state by being insulated from the susceptor, and
the controller controls the top surface electric potential of the focus ring by adjusting the gap by moving the grounding body.

2. The plasma processing apparatus of claim 1, wherein the controller adjusts the dielectric constant of the dielectric ring depending on a type of the substrate.

3. The plasma processing apparatus of claim 1, wherein the dielectric constant varying device is a conductor elevation device for vertically moving a conductor in a space formed within the dielectric ring.

4. The plasma processing apparatus of claim 1, wherein the dielectric constant varying device is configured to circulate a dielectric fluid through a space formed within the dielectric ring.

5. The plasma processing apparatus of claim 1, further comprising:
wherein the controller forms a first current route in which a first current flows from the susceptor to the substrate, from the substrate to the focus ring, and from the focus ring to the grounding body and a second current route in which a second current flows from the susceptor to the dielectric ring, from the dielectric ring to the focus ring, and from the focus ring to the grounding body,
wherein the controller adjusts the dielectric constant of the dielectric ring to control the second current, thereby controlling the first current, and
wherein the controller controls the top surface electric potential of the focus ring by controlling the first current.

* * * * *

UNITED STATES PATENT AND TRADEMARK OFFICE
CERTIFICATE OF CORRECTION

| | |
|---|---|
| PATENT NO. | : 9,076,636 B2 |
| APPLICATION NO. | : 13/232207 |
| DATED | : July 7, 2015 |
| INVENTOR(S) | : Mitsunori Ohata |

Page 1 of 1

It is certified that error appears in the above-identified patent and that said Letters Patent is hereby corrected as shown below:

In the specification,

Column 17, line 67, replace "5160" with -- S160 --

Column 18, line 5, replace "5160" with -- S160 --

Column 18, line 5, replace "5170" with -- S170 --

Signed and Sealed this
Fifth Day of January, 2016

Michelle K. Lee
*Director of the United States Patent and Trademark Office*